United States Patent
Agarwal et al.

(10) Patent No.: US 7,536,395 B2
(45) Date of Patent: May 19, 2009

(54) EFFICIENT DYNAMIC REGISTER FILE DESIGN FOR MULTIPLE SIMULTANEOUS BIT ENCODINGS

(75) Inventors: Vikas Agarwal, Austin, TX (US); William Elton Burky, Austin, TX (US); Zakaria Mahmood Khwaja, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 11/422,422

(22) Filed: Jun. 6, 2006

(65) Prior Publication Data

US 2007/0282865 A1    Dec. 6, 2007

(51) Int. Cl.
*G06F 7/00* (2006.01)
*G06F 17/30* (2006.01)

(52) U.S. Cl. .................................................. 707/100
(58) Field of Classification Search ........................ None
See application file for complete search history.

(56) References Cited

U.S. PATENT DOCUMENTS

2002/0133682 A1    9/2002  Hansen et al.

FOREIGN PATENT DOCUMENTS

EP          0357342 A1    7/1990
WO       03075579 A2    9/2003

OTHER PUBLICATIONS

Hanna, "Bit Manipulator", IBM Technical Disclosure Bulletin, Nov. 1974, pp. 1575-1576.

*Primary Examiner*—Wilson Lee
*Assistant Examiner*—Nicholas E Allen
(74) *Attorney, Agent, or Firm*—Yee & Associates, P.C.; Libby Z. Handelsman

(57) ABSTRACT

The illustrative embodiment is a circuit and method for reversing a linked list of multiple nodes to produce a reversed linked list. The circuit includes a decoder for sequentially decoding multiple original input tags, which are associated with the nodes of the linked list, to produce decoded values, an array for storing the decoded values, and a circuit for reading the array to simultaneously generate the tags that are associated with the nodes of the reversed linked list, where separate encoders are not used.

2 Claims, 5 Drawing Sheets

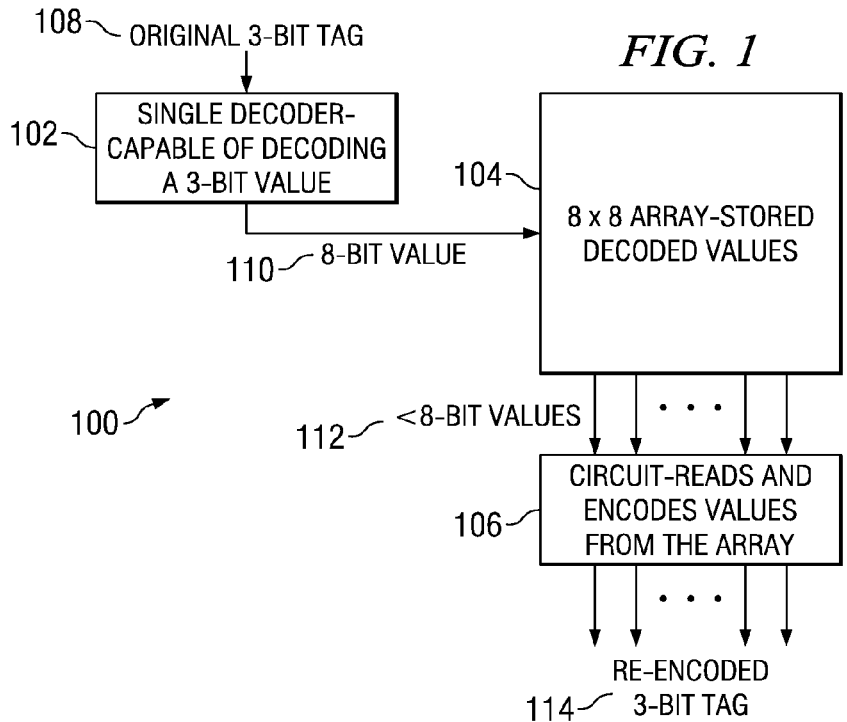

FIG. 3

| 104 | DECODED VALUE ARRAY | | | | | | | |
|---|---|---|---|---|---|---|---|---|
| 230 | BIT 0 200 | BIT 0 | BIT 0 | BIT 0 | BIT 0 | BIT 0 | BIT 0 | BIT 0 |
| | BIT 1 216 | BIT 1 | BIT 1 | BIT 1 | BIT 1 | BIT 1 | BIT 1 | BIT 1 |
| | BIT 2 218 | BIT 2 | BIT 2 | BIT 2 | BIT 2 | BIT 2 | BIT 2 | BIT 2 |
| | BIT 3 220 | BIT 3 | BIT 3 | BIT 3 | BIT 3 | BIT 3 | BIT 3 | BIT 3 |
| | BIT 4 222 | BIT 4 | BIT 4 | BIT 4 | BIT 4 | BIT 4 | BIT 4 | BIT 4 |
| | BIT 5 224 | BIT 5 | BIT 5 | BIT 5 | BIT 5 | BIT 5 | BIT 5 | BIT 5 |
| | BIT 6 226 | BIT 6 | BIT 6 | BIT 6 | BIT 6 | BIT 6 | BIT 6 | BIT 6 |
| | BIT 7 228 | BIT 7 | BIT 7 | BIT 7 | BIT 7 | BIT 7 | BIT 7 | BIT 7 |
| | COLUMN 0 | COLUMN 1 | COLUMN 2 | COLUMN 3 | COLUMN 4 | COLUMN 5 | COLUMN 6 | COLUMN 7 |

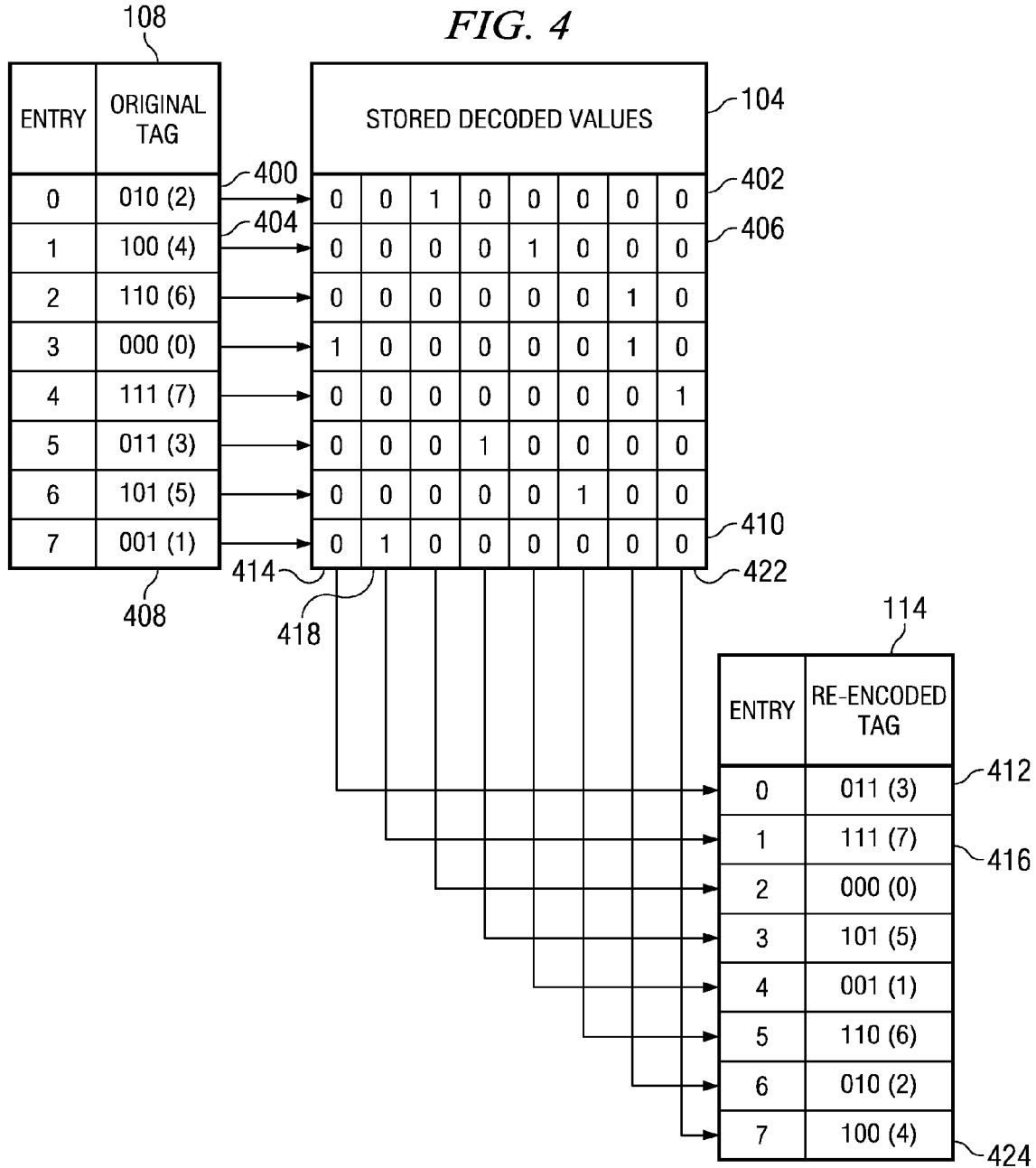

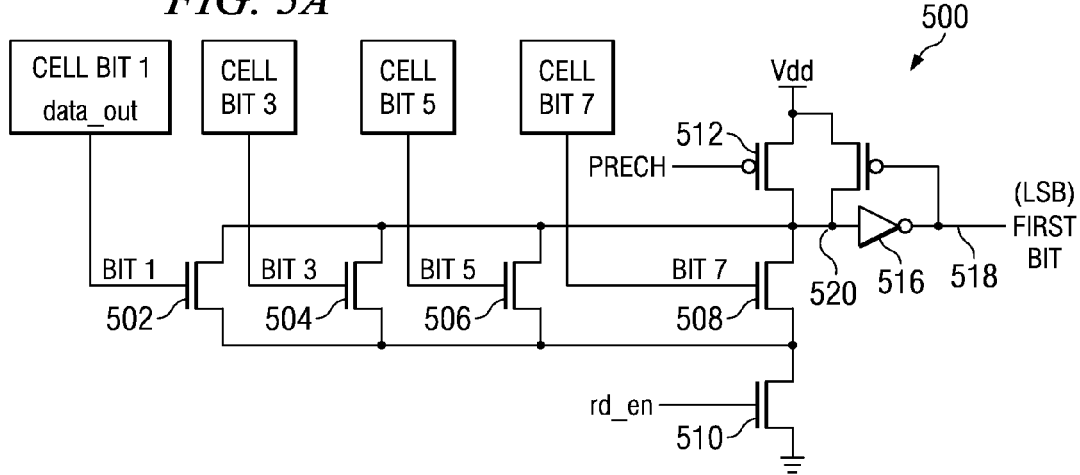
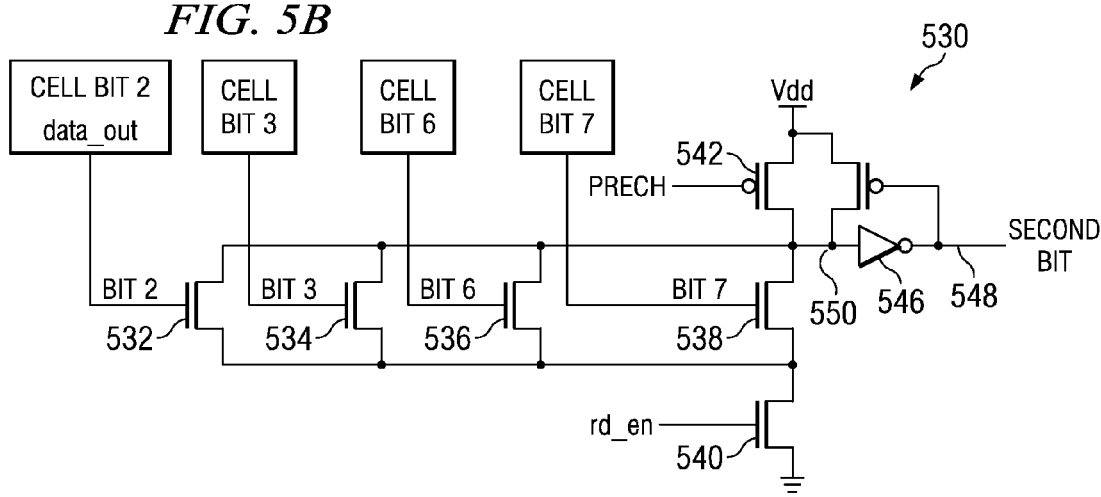
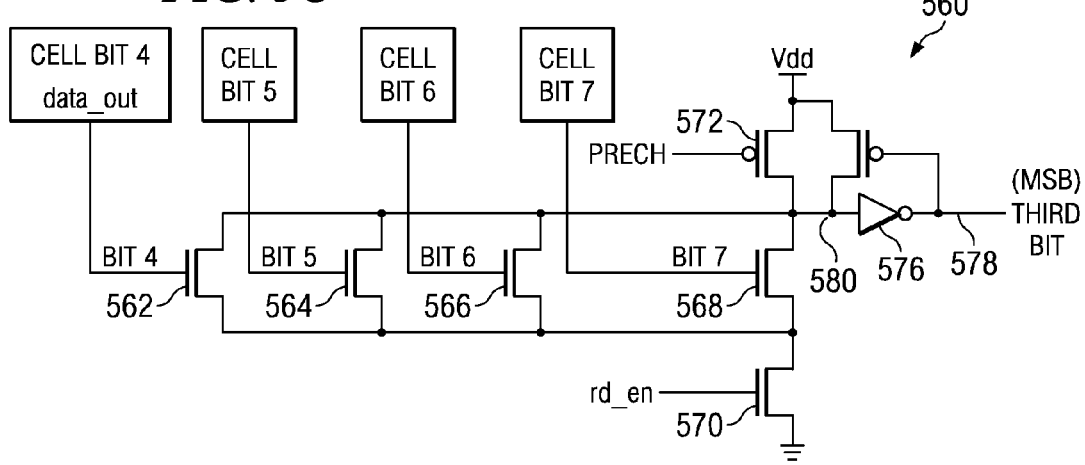

EFFICIENT DYNAMIC REGISTER FILE DESIGN FOR MULTIPLE SIMULTANEOUS BIT ENCODINGS

BACKGROUND OF THE INVENTION

1. Field of the Invention

The present invention relates generally to an efficient dynamic register file design for multiple simultaneous bit encodings.

2. Description of the Related Art

FIG. 6 is a prior art system 600 for decoding original input values, referred to herein as tags or tag values, and then re-encoding the decoded tag values to produce re-encoded output tag values. To simplify the explanation it is assumed that there are 8 different original input tag values, although any number of input tag values can be used. Since there are 8 different values, each input tag value is a 3-bit binary number.

System 600 includes a separate decoder for each input tag. Each decoder decodes the input tag that it receives in order to produce a decoded output.

For example, decoder 602 decodes a first input tag, input tag 604, and outputs decoded value 606. A separate decoder, decoder 608, decodes a second input tag, input tag 610, and outputs decoded value 612. Additional separate decoders, not shown, decode the $3^{rd}$-$6^{th}$ input tags to produce the $3^{rd}$-$6^{th}$ decoded values. Decoder 614 decodes input tag 616, and outputs decoded value 618. Decoder 620 decodes input tag 622, and outputs decoded value 624.

A transpose network 626 receives the 8 8-bit decoded values from all of the decoders. Transpose network 626 transposes the decoded values it receives. Transpose network 626 then outputs 8 transposed values. Transpose network 626 outputs each one of the 8 columns as an 8-bit transposed value to an encoder. There is one encoder for each one of the 8 values. For example, the first column is output to encoder 628 as 8-bit value 630. Encoder 628 then encodes value 630 and outputs the encoded value as 3-bit output tag 632.

The second column is output to encoder 634 as 8-bit value 636. Encoder 634 then encodes value 636 and outputs the encoded value as 3-bit output tag 638.

Columns 3-6 are output to separate encoders, not shown, as 8-bit values in a similar manner to that described above. These encoders then encode those 8-bit values and output the encoded values as 3-bit tag values.

The $7^{th}$ column is output to encoder 640 as 8-bit value 642. Encoder 640 then encodes value 642 and outputs the encoded value as 3-bit output tag 644.

The $8^{th}$ column is output to encoder 646 as 8-bit value 648. Encoder 646 then encodes value 648 and outputs the encoded value as 3-bit output tag 650.

The 8 3-bit tag values are then received by and stored in storage 652.

According to the prior art, system 600 does not store the decoded values 606, 612, 618, and 624. System 600 stores only the re-encoded tags 632, 638, 644, and 650.

The prior art decodes the 8 3-bit original tags in parallel using a separate decoder for each 3-bit value. As a result of using a separate decoder for each input tag value, system 600 requires a substantial amount of physical space in which to implement these decoders. In addition, system 600 requires a substantial amount of power in order to simultaneously power all of those separate decoders.

The same disadvantages exist in the prior art for re-encoding the transposed values. There is a separate encoder for each transposed value. Therefore, in the example given, there are 8 separate encoders. As a result of using a separate encoder for each transposed value, system 600 requires a substantial amount of physical space to implement these encoders. In addition, system 600 requires a substantial amount of power in order to simultaneously power all of those separate encoders.

SUMMARY OF THE INVENTION

The illustrative embodiment is a circuit and method for reversing a linked list of multiple nodes to produce a reversed linked list. The circuit includes a decoder for sequentially decoding multiple original input tags, which are associated with the nodes of the linked list, to produce decoded values, an array for storing the decoded values, and a circuit for reading the array to simultaneously generate the tags that are associated with the nodes of the reversed linked list, where separate encoders are not used.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is a block diagram of the circuit for efficiently and simultaneously generating re-encoded bit tag values in accordance with the illustrative embodiment;

FIG. 2 is a block diagram of the storage cells that are included in an array in which decoded values are stored in accordance with the illustrative embodiment;

FIG. 3 is a block diagram of the storage cells that are included in an array from which values are read out of the array in accordance with the illustrative embodiment;

FIG. 4 depicts one example of original tag values that are associated with a linked list and the resulting re-encoded output tag values that are associated with the reversed linked list in accordance with the illustrative embodiment;

FIG. 5A is a schematic diagram of a circuit that is used to generate the least significant bit, which is identified as the first bit, of a 3-bit re-encoded tag value in accordance with the illustrative embodiment;

FIG. 5B is a schematic diagram of a circuit that is used to generate the middle bit, which is identified as the second bit, of the 3-bit re-encoded output tag value in accordance with the illustrative embodiment;

FIG. 5C is a schematic diagram of a circuit that is used to generate the most significant bit, which is identified as the third bit, of the 3-bit re-encoded output tag value in accordance with the illustrative embodiment.

DETAILED DESCRIPTION OF THE PREFERRED EMBODIMENT

Figure 6:
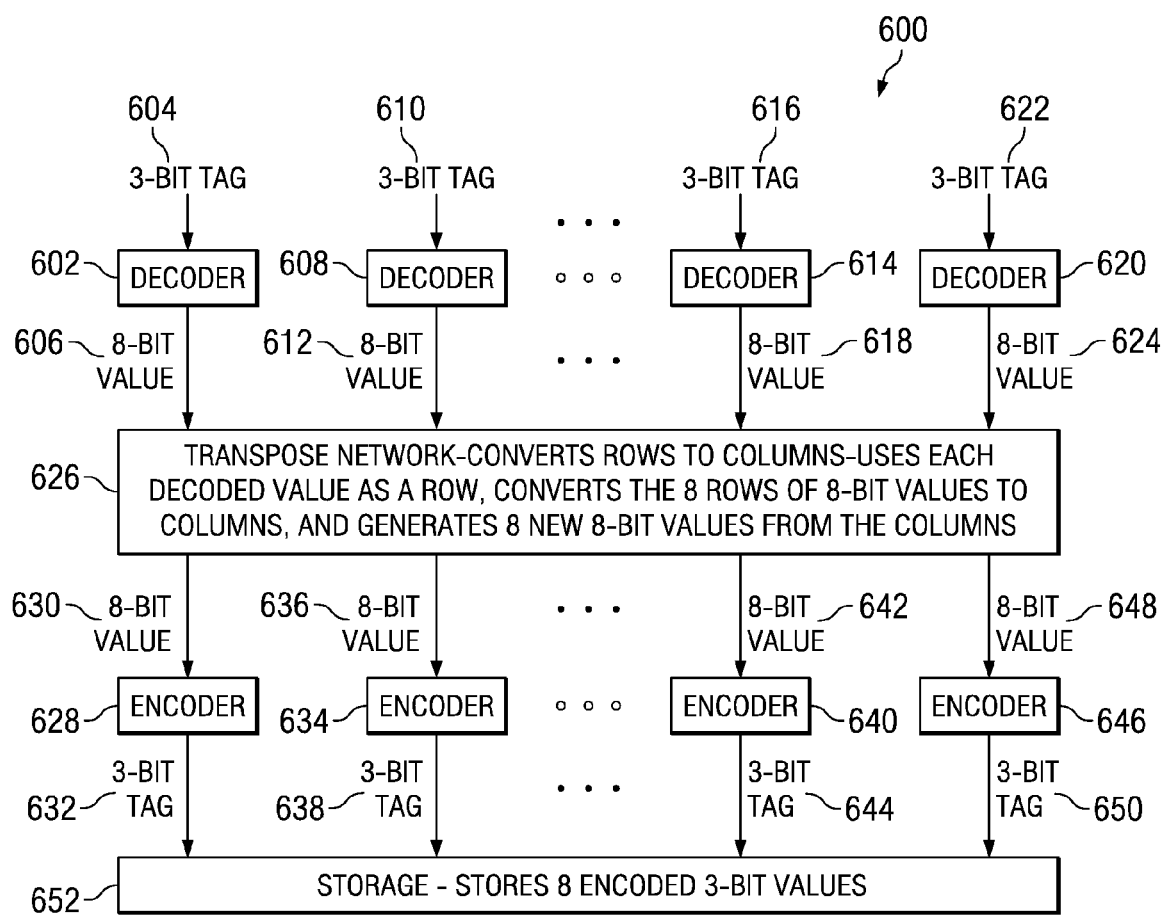
FIG. 6 is a prior art system for decoding original tag values and then re-encoding the decoded values using separate encoders for each value.

The present invention is a method and apparatus for reversing a linked list of a plurality of nodes.

A linked list is a list of nodes. Each node includes both data and a pointer to the next node in the list. The present invention is a compact circuit that receives a linked list of nodes and efficiently produces a reversed linked list such that the last node in the original linked list becomes the first node in the reversed linked list. Each node in the reversed linked list then points to the previous node from the original linked list.

The compact circuit includes a single decoder, an array, and a circuit for reading from the array in parallel to simultaneously generate the reversed linked list. The circuit does not include separate decoders for decoding each tag of the linked list, nor does it include separate encoders to generate the tags of the reversed linked list.

Original tag values are received by the single decoder sequentially. The position of each tag within the order in which the tags are received indicates within which row the decoded tag will be stored. Thus, once the first tag received by the decoder is decoded, the decoded value will be stored in the first row, i.e. row 0, of the array. Once the second tag received by the decoder is decoded, its decoded value will be stored in the second row, i.e. row 1, of the array. This process continues receiving one tag at a time until the last tag is received. Once the last tag received by the decoder is decoded, its decoded value will be stored in the last row, i.e. row 7 when the tag is a 3-bit value, of the array.

Although a single decoder is depicted, those of original skill in the art will recognize that multiple decoders can be used.

Each row of the array is associated with a particular node within the original linked list. The entry in each row identifies a particular node to which the node, which is associated with the row in which the entry is stored, points. For example, the first row of the array is row 0. Row 0 is associated with node 0. The entry in row 0 identifies the node to which node 0 points. The next row of the array is row 1. The entry in row 1 identifies the node to which node 1 points. If the entry in row 1 is a value of 4, then node 1 points to node 4. If the entry in row 4 is a value of 7, then node 4 points to node 7. If the entry in row 7 is a value of 1, node 7 points to node 1 which indicates that the end of the this original linked list has been reached. Thus, the original linked list is: node 1 which points to node 4 which points to node 7 which points to node 1.

Each column of the array is associated with a particular node within the reversed linked list. The entry in each column identifies a particular node to which the node, which is associated with the column in which the entry is stored, points. For example, the first column of the array is column 0. Column 0 is associated with node 0. The entry in column 0 identifies the node to which node 0 points. The next column in the array is column 1. Column 1 is associated with node 1. If the entry in column 1 is a value of 7, then node 1 points to node 7. If the entry in column 7 is a value of 4, then node 7 points to node 4. If the entry in column 4 is a value of 1, then node 4 points to node 1, which indicates that the end of the reversed linked list has been reached. Thus, the reversed linked list is node 1 which points to node 7 which points to node 4 which points to node 1.

Tags for one or more linked lists may be received to be decoded and then their decoded values stored in the single array. One or more reversed linked lists can then be generated from the array.

Continuing with the example given above, the same array that stores the original linked list of node 1 pointing to node 4 which points to node 7 which points to node 1 can also simultaneously store a second original linked list which may be node 0 which points to node 2 which points to node 6 which points to node 5 which points to node 3 which points to node 0.

FIG. 1 is a block diagram of a circuit for efficiently and simultaneously generating a reversed linked list in accordance with an illustrative embodiment. Circuit 100 includes a single decoder 102 for decoding original input values, an array 104 for storing decoded values, and a circuit 106 for reading array 104 and for simultaneously generating encoded output tag values from the decoded values that are stored in array 104 to produce the reversed linked list.

According to one important feature of the illustrative embodiment, only one decoder is used to decode all original input tag values of the linked list, and no stand-alone encoders are used to generate the reversed linked list.

Single decoder 102 receives each original tag value 108, one at a time. According to the illustrative embodiment, each original tag input value is a 3-bit value. Decoder 102 decodes a 3-bit original tag value and produces an 8-bit decoded value.

While only 3-bit tags are depicted, those skilled in the art will recognize that a tag is typically much greater than 3 bits. Although tag values are typically 6-bit values, those skilled in the art will also recognize that the depicted embodiment can be expanded to accommodate greater than 6-bit values.

Decoder 102 is capable of decoding a single 3-bit value to produce an 8-bit value. After decoder 102 decodes an original tag 108, it outputs the decoded value 110 to be stored in a row within array 104. Decoder 102 receives 8 original tag values 108, one at a time, and then outputs 8 decoded values 110, one at a time, to be stored in array 104. Each decoded value is stored in a separate row within array 104. Therefore, array 104 includes 8 rows and 8 columns. In this manner, array 104 is populated row by row until all 8 decoded values are stored.

The first tag that decoder 102 decodes will be stored as entry 0 in row 0 of array 104. Row 0 is associated with node 0 of the original linked list. The next tag that decoder 102 decodes will be stored as entry 1 in row 1. Row 1 is associated with node 1 of the original linked list. This process continues until array 104 is full.

Once array 104 is full, circuit 106 can be used to read a bit value 112 from array 104 and output an encoded value 114. According to another important feature, value 112 that circuit 106 reads from array 104 includes less than the number of decoded bits. Therefore, according to the illustrative embodiment, value 112 includes less than 8 bits. The bits of value 112 are then used to produce a re-encoded output tag value 114.

Circuit 106 simultaneously generates all tags that are needed in order to produce the reversed linked list. In the example given above where there are 8 original tags, circuit 106 simultaneously generates all 8 tags of the reversed linked list.

Because circuit 106 can be used at anytime to produce each re-encoded value 114, the re-encoded values are not stored in accordance with the illustrative embodiment. However, those skilled in the art will recognize that the re-encoded values could be stored without altering the scope or intent of the illustrative embodiment.

As another example, original tag could include 6 bits, instead of 3 bits. In this example, the decoded value 110 will include 64 bits, array 104 would include 64 rows and 64 columns, and value 112 would include less than 64 bits. Circuit 106 could then be used to generate an encoded output tag, which would be a 6-bit value.

FIG. 2 is a block diagram of the storage cells that are included in an array in which decoded values are stored in accordance with the illustrative embodiment. FIG. 2 depicts the storage of decoded values into array 104. The depicted array, i.e. array 104, includes 8 rows 215, each row for storing one of the 8-bit decoded values 110.

Single decoder 102 receives 8 original tag values 108 sequentially. As each original tag value 108 is received, it is decoded by decoder 102 to produce an 8-bit decoded value 110. Array 104 then receives the 8 decoded values 110 sequentially from decoder 102. As decoded values 110 are received by array 104, they are stored in successive rows in array 104. Thus, bits 0-7 of the first decoded value are stored in a first row, row 0, of array 104. Bits 0-7 of the second decoded value are stored in row 1. This continues, storing bits 0-7 of each received decoded value in a next empty row, until bits 0-7 of the final decoded value 110 are stored in row 7.

For example, bit 0 of the first decoded value 110 is stored in cell 200. Bit 1 of the first decoded value 110 is stored in cell 202. Bit 2 of the first decoded value 110 is stored in cell 204. Bit 3 of the first decoded value 110 is stored in cell 206. Bit 4 of the first decoded value 110 is stored in cell 208. Bit 5 of the first decoded value 110 is stored in cell 210. Bit 6 of the first decoded value 110 is stored in cell 212. Bit 7 of the first decoded value 110 is stored in cell 214.

Because the illustrative embodiment depicts 8 3-bit input tags, 8 8-bit decoded values are generated. In this example, array 104 is an 8×8 bit array that includes 64 different cells.

If the input tags are 6 bits, 64 64-bit decoded values are generated. In this example, array 104 would be a 64×64 bit array that includes 4096 cells.

FIG. 3 is a block diagram of the storage cells that are included in an array from which values are read out of the array in accordance with the illustrative embodiment.

Although decoded values 110 are stored in array 104 in successive rows, values 112 are read out from array 104 from columns 230. For example, column 0 includes bits 0-7 of a first value. Column 1 includes bits 0-7 of a second value and so on with column 7 including bits 0-7 of a last value, i.e. the 8$^{th}$ value.

For example, bit 0 of the first value from column 0 is read out from cell 200. Bit 1 of the first value from column 0 is read out from cell 216. Bit 2 of the first value from column 0 is read out from cell 218. Bit 3 of the first value from column 0 is read out from cell 220. Bit 4 of the first value from column 0 is read out from cell 222. Bit 5 of the first value from column 0 is read out from cell 224. Bit 6 of the first value from column 0 is read out from cell 226. Bit 7 of the first value from column 0 is read out from cell 228.

As will become clear through the description below, each value 112 that is read out from one of the columns of array 104 includes less than 8 bits.

FIG. 4 depicts one example of original tag values and the resulting re-encoded output tag values in accordance with the illustrative embodiment.

FIG. 4 depicts where each decoded input tag value will be stored in array 104, and how those decoded values are transposed when reading from array 104.

Each entry is associated with a particular node in the linked list. The tag that is received for that entry identifies which node is the next node in the linked list.

Tags are received by the decoder sequentially, one at a time. The first received tag is decoded, and its decoded value is stored in entry 0 in array 104.

Each row of the array is associated with a particular node within the original linked list. The entry in each row identifies a particular node to which the node, which is associated with the row in which the entry is stored, points. The first row of the array is row 0. Row 0 is associated with node 0. The next row of the array is row 1. The entry in row 1 identifies the node to which node 1 points.

FIG. 4 depicts an example where the entry in row 1 is a value of 4; thus node 1 points to node 4. The entry in row 4 is a value of 7; thus, node 4 points to node 7. The entry in row 7 is a value of 1; thus, node 7 points to node 1 which indicates that the end of this original linked list has been reached. Thus, the original linked list is node 1 which points to node 4 which points to node 7 which points to node 1.

Each column of the array is associated with a particular node within the reversed linked list. The entry in each column identifies a particular node to which the node, which is associated with the column in which the entry is stored, points. The first column of the array is column 0. Column 0 is associated with node 0. The entry in column 0 identifies the node to which node 0 points. The next column in the array is column 1. Column 1 is associated with node 1.

Continuing with the example of FIG. 4, the entry in column 1 is a value of 7; thus, node 1 points to node 7. The entry in column 7 is a value of 4; thus, node 7 points to node 4. The entry in column 4 is a value of 1; thus, node 4 points to node 1 which indicates that the end of the first reversed linked list has been reached. Therefore, the reversed linked list is node 1 which points to node 7 which points to node 4 which points to node 1.

Tags for one or more linked lists may be received to be decoded and then their decoded values stored in the single array. One or more reversed linked lists can then be generated from the array.

Continuing with the example given above, array 104 can also simultaneously store a second original linked list and can be used to generate a second reversed linked list. The entry in row 0 is a value of 2; thus, node 0 points to node 2. The entry in row 2 is a value of 6; thus, node 2 points to node 6. The entry in row 6 is a value of 5; thus, node 6 points to node 5. The entry in row 5 is a value of 3; thus, node 5 points to node 3. The entry in row 3 is a value of 0; thus, node 3 points to node 0 which indicates that the end of the second original linked list has been reached. Thus, the second original linked list is node 0 which points to node 2 which points to node 6 which points to node 5 which points to node 3 which points to node 0.

The second reversed linked list can be simultaneously generated by reading columns of array 104. The entry in column 0 is a value of 3; thus, node 0 points to node 3. The entry in column 3 is a value of 5; thus, node 3 points to node 5. The entry in column 5 is a value of 6; thus, node 5 points to node 6. The entry in column 6 is a value of 2; thus, node 6 points to node 2. The entry in node 2 is a value of 0; thus, node 2 points to node 0 which indicates that the end of the second reversed linked list has been reached. Thus, the second reversed linked list is node 0 pointing to node 3 which points to node 5 which points to node 6 which points to node 2 which points to node 0.

Referring again to FIG. 4, the first value 108, indicated in entry 0, reference number 400, is a 3-bit binary value of 010. This binary value is decoded by decoder 104. The resulting decoded value 110, which is 00100000, is stored in row 0, reference number 402, of array 104.

The second value 108, indicated in entry 1, reference number 404, is a 3-bit binary value of 100. This binary value is decoded by decoder 104. The resulting decoded value 110, which is 00001000, is stored in row 1, reference number 406, of array 104.

This process continues storing each decoded tag value 110 in successive rows of array 104 until a final value 110, indicated in entry 7, reference number 408, is reached. The final value is a 3-bit binary value of 001. This binary value is decoded by decoder 104 and produces a decoded value 110 of 01000000. This decoded value is stored in row 7, reference number 410, of array 104.

Once all decoded values 110 are stored in array 104, circuit 106 can be used to generate re-encoded output tag values 114. To produce a re-encoded output tag value 114, only selected bits from one of the columns of array 104 are read. Circuit 106 does not require all bits from a column in order to generate a re-encoded value.

For example, to generate the first re-encoded tag value 114, indicated by entry 0, reference number 412, selected bits are read from column 0, reference number 414, of array 104. The value that is stored in column 0, reference number 414, is 00010000. This value can then be re-encoded to produce a 3-bit output tag value 114 of 011, reference number 412. According to the illustrative embodiment, only selected bits from column 0 are needed in order to produce output tag value 114 of 011.

Similarly, to generate the second re-encoded tag value 114, indicated by entry 1, reference number 416, selected bits are read from column 1, reference number 418, of array 104. The value that is stored in column 1, reference number 418, is 00000001. This value can then be re-encoded to produce the 3-bit output tag value 114 of 111, reference number 416. According to the illustrative embodiment, only selected bits from column 1, reference number 418, are needed in order to produce output tag value 114 of 111, reference number 416.

To generate the final re-encoded tag value 114, indicated by entry 7, reference number 424, selected bits are read from column 7, reference number 422, of array 104. The value that is stored in column 7, reference number 422, is 00001000. This value can then be re-encoded to produce a 3-bit output tag value 114 of 100, reference number 424. According to the illustrative embodiment, only selected bits from column 7, reference number 422, are needed in order to produce output tag value 114 of 111, reference number 424.

The circuits of FIGS. 5A-5C together make up the circuit 106. Circuit 106 includes the circuits of FIGS. 5A-5C. The circuits of FIGS. 5A-5C act simultaneously to generate one output tag value. Circuit 106 also includes circuits that are similar to the circuits of FIGS. 5A-5B for each output tag value. Therefore, if there are 8 output tag values, circuit 106 will include 8 circuits that are similar to FIG. 5A that are used to generate the least significant bit of each output tag, 8 circuits that are similar to FIG. 5B that are used to generate the middle bit of each output tag, and 8 circuits that are similar to FIG. 5C that are used to generate the most significant bit of each output tag.

FIG. 5A is a schematic diagram of a dynamic precharge circuit 500 that is used to generate the least significant bit, which is identified as the first bit, of the 3-bit output tag value in accordance with the illustrative embodiment.

Circuit 106 generates an output tag using only selected bits from a column of array 104. For example, according to the illustrative embodiment, circuit 106 generates the least significant bit of the output tag using only the odd bits from a column.

FIG. 5A acts as a large OR gate to OR the bit values that are read from a column of array 104 and to generate the OR of all of these bit values. Each bit value is received at the gate of an n-channel transistor. The n-channel transistors that receive a bit value are coupled together in parallel with the sources of each transistor and the drains of each transistor coupled together. A read enable signal is received at the gate of an n-channel transistor that controls whether circuit 500 generates the OR result of the input bit values.

Only bits 1, 3, 5, and 7 are used to generate the first bit, i.e. the least significant bit (LSB), of an output tag value. For example, to generate the first bit of the first re-encoded value 114, only bits 1, 3, 5, and 7 from column 0 are needed. Thus, the values stored in cells 216, 220, 224, and 228 are needed and read out of column 0.

As a specific example, referring to FIG. 4, column 414 has a bit 1 value of 0, a bit 3 value of 1, a bit 5 value of 0 and a bit 7 value of 0. Circuit 500 receives the value of bit 1 at the gate of n-channel transistor 502, the value of bit 3 at the gate of n-channel transistor 504, the value of bit 5 at the gate of transistor 506, and the value of bit 7 at the gate of transistor 508.

A read enable signal is received at the gate of n-channel transistor 510. The source of transistor 510 is connected to the drains of transistors 502, 504, 506, and 508. The drain of transistor 510 is connected to ground.

A precharge signal is received at the gate of p-channel transistor 512. The source of transistor 512 is connected to a voltage source Vdd. The drain of transistor 512 is coupled to the sources of transistors 502, 504, 506, and 508.

When the read enable signal is a logic value of 1, the values of bits 1, 3, 5, and 7 are ORed together and the resulting value is received at the input node of inverter 516 which inverts the value and outputs the resulting value as a first bit value 518.

The precharge signal, which is received at the gate of transistor 512, is a clock signal that is 0 for half of each clock period and 1 for the other half of each clock period. When the precharge signal is 0, the dynamic node 520 is precharged to a value of 1 so that signal 518 is a 0. When the precharge signal is 1, the circuit 500 performs its OR function to OR the values of bits 1, 3, 5 and 7 if the read enable signal, which is received at the gate of transistor 510, is also a 1.

Following the example given above, if bit 1 has a value of 0, bit 3 has a value of 1, bit 5 has a value of 0, and bit 7 has a value of 0, the resulting output will be a bit having the value of 1 when the precharge signal and the read enable signals are both 1s.

FIG. 5B is a schematic diagram of a dynamic precharge circuit 530 that is used to generate the middle bit, which is identified as the second bit, of the 3-bit output tag value in accordance with the illustrative embodiment.

FIG. 5B acts as a large OR gate to OR the bit values that are read from a column of array 104 and to generate the OR of all of these bit values. Each bit value is received at the gate of an n-channel transistor. The n-channel transistors that receive a bit value are coupled together in parallel with the sources of each transistor and the drains of each transistor coupled together. A read enable signal is received at the gate of an n-channel transistor that controls whether circuit 530 generates the OR result of the input bit values.

Only bits 2, 3, 6, and 7 are used to generate the second bit of the output tag value. For example, to generate the second bit of the first re-encoded value 114, only bits 2, 3, 6, and 7 from column 0 are needed. Thus, the values stored in cells 218, 220, 226, and 228 are needed and read out of column 0.

As a specific example, referring to FIG. 4, column 414 has a bit 2 value of 0, a bit 3 value of 1, a bit 6 value of 0 and a bit 7 value of 0. Circuit 530 receives the value of bit 2 at the gate of n-channel transistor 532, the value of bit 3 at the gate of n-channel transistor 534, the value of bit 6 at the gate of transistor 536, and the value of bit 7 at the gate of transistor 538.

A read enable signal is received at the gate of n-channel transistor 540. The source of transistor 540 is connected to the drains of transistors 532, 534, 536, and 538. The drain of transistor 540 is connected to ground.

A precharge signal is received at the gate of p-channel transistor 542. The source of transistor 542 is connected to a voltage source Vdd. The drain of transistor 542 is coupled to the sources of transistors 532, 534, 536, and 538.

When the read enable signal is a logic value of 1, the values of bits 2, 3, 6, and 7 are ORed together and the resulting value is received at the input node of inverter 546 which inverts the value and outputs the resulting value as the second bit value 548.

The precharge signal, which is received at the gate of transistor 542, is a clock signal that is 0 for half of each clock period and 1 for the other half of each clock period. When the precharge signal is 0, the dynamic node 550 is precharged to a value of 1 so that signal 548 is a 0. When the precharge signal is 1, the circuit 530 performs its OR function to OR the values of bits 2, 3, 6 and 7 if the read enable signal, which is received at the gate of transistor 540, is also a 1.

Following the example given above, if bit 2 has a value of 0, bit 3 has a value of 1, bit 6 has a value of 0, and bit 7 has a value of 0, the resulting output will be a bit having the value of 1 if the precharge signal and read enable signals are both is.

FIG. 5C is a schematic diagram of a dynamic precharge circuit 560 that is used to generate the third bit, i.e. the most significant bit (MSB), of the 3-bit output tag value in accordance with the illustrative embodiment.

FIG. 5C acts as a large OR gate to OR the bit values that are read from a column of array 104 and to generate the OR of all of these bit values. Each bit value is received at the gate of an n-channel transistor. The n-channel transistors that receive a bit value are coupled together in parallel with the sources of each transistor and the drains of each transistor coupled together. A read enable signal is received at the gate of an n-channel transistor that controls whether circuit 530 generates the OR result of the input bit values.

Only bits 4, 5, 6, and 7 are used to generate the third bit of the output tag value. For example, to generate the third bit of the first re-encoded value 114, only bits 4, 5, 6, and 7 from column 0 are needed. Thus, the values stored in cells 222, 224, 226, and 228 are needed and read out of column 0.

As a specific example, referring to FIG. 4, column 414 has a bit 4 value of 0, a bit 5 value of 0, a bit 6 value of 0 and a bit 7 value of 0.

Circuit 560 receives the value of bit 4 at the gate of n-channel transistor 562, the value of bit 5 at the gate of n-channel transistor 564, the value of bit 6 at the gate of transistor 566, and the value of bit 7 at the gate of transistor 568.

A read enable signal is received at the gate of n-channel transistor 570. The source of transistor 570 is connected to the drains of transistors 562, 564, 566, and 568. The drain of transistor 570 is connected to ground.

A precharge signal is received at the gate of p-channel transistor 572. The source of transistor 572 is connected to a voltage source Vdd. The drain of transistor 572 is coupled to the sources of transistors 562, 564, 566, and 568.

When the read enable signal is a logic value of 1, the values of bits 4, 5, 6, and 7 are ORed together and the resulting value is received at the input node of inverter 576 which inverts the value and outputs the resulting value as the third bit value 578.

The precharge signal, which is received at the gate of transistor 572, is a clock signal that is 0 for half of each clock period and 1 for the other half of each clock period. When the precharge signal is 0, the dynamic node 580 is precharged to a value of 1 so that signal 578 is a 0. When the precharge signal is 1, the circuit 560 performs its OR function to OR the values of bits 4, 5, 6, and 7 if the read enable signal, which is received at the gate of transistor 570, is also a 1.

Following the example given above, if bit 4 has a value of 0, bit 5 has a value of 0, bit 6 has a value of 0, and bit 7 has a value of 0, the resulting output will be a bit having the value of 0 if the precharge signal and read enable signals are both 1s.

The first bit, output as signal 518 (see FIG. 5A), the second bit, output as signal 548 (see FIG. 5B), and the third bit, output as signal 578 (see FIG. 5C) make up the re-encoded output tag, reference 412.

In a similar manner, the other re-encoded output tag values can be generated using the circuits of 500, 530 and 560 by reading the bits as depicted from the other columns of array 104. For example, bits 1, 3, 5, and 7 can be read from column 418 in order to generate the first bit of re-encoded output tag value 416. Thus, since bit 1 is a logic 0, bit 3 is a logic 0, bit 5 is a logic 0, and bit 7 is a logic 1, the first output bit is a logic 1. Bits 2, 3, 6, and 7 can be read from column 418 in order to generate the second bit of re-encoded output tag value 416. Thus, since bit 2 is a logic 0, bit 3 is a logic 0, bit 6 is a logic 0, and bit 7 is a logic 1, the second output bit is a logic 1. Bits 4, 5, 6, and 7 can be read from column 418 in order to generate the third bit of re-encoded output tag value 416. Thus, since bit 4 is a logic 0, bit 5 is a logic 0, bit 6 is a logic 0, and bit 7 is a logic 1, the third output bit is a logic 1. Therefore, the re-encoded output tag is ill, reference 416.

As a final example, the other re-encoded output tag values can be generated using the circuits of 500, 530 and 560 by reading the bits as depicted from the other columns of array 104. For example, bits 1, 3, 5, and 7 can be read from column 422 in order to generate the first bit of re-encoded output tag value 424. Thus, since bit 1 is a logic 0, bit 3 is a logic 0, bit 5 is a logic 0, and bit 7 is a logic 0, the first output bit is a logic 0. Bits 2, 3, 6, and 7 can be read from column 418 in order to generate the second bit of re-encoded output tag value 416. Thus, since bit 2 is a logic 0, bit 3 is a logic 0, bit 6 is a logic 0, and bit 7 is a logic 0, the second output bit is a logic 0. Bits 4, 5, 6, and 7 can be read from column 418 in order to generate the third bit of re-encoded output tag value 416. Thus, since bit 4 is a logic 1, bit 5 is a logic 0, bit 6 is a logic 0, and bit 7 is a logic 0, the third output bit is a logic 1. Therefore, the re-encoded output tag is 100, reference 424.

For the example where array 104 is a 64×64 bit array, cells 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, and 63 of column 0 are connected to produce the LSB of entry 0. Cells 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, and 61 of column 1 are connected to produce the LSB of entry 1.

To complete the 64×64 bit array example, cells 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, and 63 of column 0 are connected to produce bit 0 of entry 0. Cells 2, 3, 6, 7, 10, 11, 14, 15, 18, 19, 22, 23, 26, 27, 30, 31, 34, 35, 38, 39, 42, 43, 46, 47, 50, 51, 54, 55, 58, 59, 62, and 63 of column 0 are connected to produce bit 1 of entry 0. Cells 4, 5, 6, 7, 12, 13, 14, 15, 20, 21, 22, 23, 28, 29, 30, 31, 36, 37, 38, 39, 44, 45, 46, 47, 52, 53, 54, 55, 60, 61, 62, and 63 of column 0 are connected to produce bit 2 of entry 0. Cells 8, 9, 10, 11, 12, 13, 14, 15, 24, 25, 26, 27, 28, 29, 30, 31, 40, 41, 42, 43, 44, 45, 46, 47, 56, 57, 58, 59, 60, 61, 62, and 63 of column 0 are connected to produce bit 3 of entry 0. Cells 16, 17, 18, 19, 20, 21, 22, 23, 24, 25, 26, 27, 28, 29, 30, 31, 48, 49, 50, 51, 52, 53, 54, 55, 56, 57, 58, 59, 60, 61, 62, and 63 of column 0 are connected to produce bit 4 of entry 0. Cells 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, and 63 of column 0 are connected to produce bit 5 of entry 0. Bit 0 is the least significant bit, and bit 5 is the most significant bit.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A compact circuit for reversing a linked list of a plurality of nodes to produce a reversed linked list, the circuit comprising:
   a decoder for sequentially decoding a plurality of tags to produce a plurality of decoded values;
   an array for storing the plurality of decoded values;
   the array receiving the plurality of decoded values one at a time and storing each received one of the plurality of decoded values in a next empty row within the array;
   a dynamic precharge circuit for reading selected bit values from each one of a plurality of columns of the array to simultaneously generate each one of a plurality of nodes of the reversed linked list;
   a first circuit comprising:
      a plurality of first transistors, each one of the plurality of first transistors for receiving one of a plurality of bits from each one of a plurality of columns of the array;
      the plurality of first transistors used to generate a first logical OR output and a logical OR signal; and
      the first logical OR output being a first bit of an output;
   a precharge transistor for receiving a precharge signal, the first circuit being precharged responsive to the precharge signal being asserted, wherein the first circuit does not output the logical OR signal when the precharge signal is asserted;
   a read enable transistor for receiving a read enable signal, the first circuit outputting the logical OR signal responsive to the read enable signal being asserted and the precharge signal being de-asserted; and
   a second circuit that includes;
      a plurality of second transistors, each one of the plurality of second transistors for receiving one of the plurality of bits from each one of the plurality of columns of the array;
      the plurality of second transistors used to logically OR the received ones of the plurality of bits together to generate a second logical OR output; and
      the second logical OR output being a second bit of an output tag.

2. A method in a compact circuit for reversing a linked list of a plurality of nodes to produce a reversed linked list, the method comprising:
   sequentially decoding, using a plurality of decoders, a plurality of tags to produce a plurality of decoded values;
   receiving the plurality of decoded values one at a time;
   storing, in an array, the plurality of decoded values in a next empty row within the array;
   reading, using a circuit, selected bit values from each one of a plurality of columns of the array to simultaneously generate each one of a plurality of nodes of the reversed linked list, wherein the circuit is a dynamic precharge circuit;
   receiving, by each one of a plurality of transistors of a first circuit, one of a plurality of bits from each one of the plurality of columns of the array;
   generating, using the plurality of transistors, a first logical OR of the received one of the plurality of bits to generate a first logical OR output and a logical OR signal, wherein the first logical OR output is a first bit of an output;
   receiving, by a read enable transistor, a read enable signal;
   receiving, by a precharge transistor, a precharge signal;
   responsive to the precharge signal being asserted, precharging the first circuit, wherein the first circuit does not output the logical OR signal when the precharge signal is asserted;
   responsive to the read enable signal being asserted and the precharge signal being de-asserted, outputting, by the first circuit, the logical OR signal;
   receiving, by each one of a plurality of transistors of a second circuit, one of the plurality of bits from each one of the plurality of columns of the array; and
   generating, using the plurality of transistors of the second circuit, a second logical OR of the received ones of the plurality of bits to generate a second logical OR output, wherein the second logical OR output is a second bit of an output tag.

* * * * *